United States Patent [19]

Chatterjee et al.

[11] Patent Number: 4,896,243
[45] Date of Patent: Jan. 23, 1990

[54] EFFICIENT ESD INPUT PROTECTION SCHEME

[75] Inventors: Amitava Chatterjee, Richardson; Charvaka Duvvury, Plano, both of Tex.

[73] Assignee: Texas Instruments Incorporated, Dallas, Tex.

[21] Appl. No.: 287,427

[22] Filed: Dec. 20, 1988

[51] Int. Cl.$^4$ .............................................. H02H 9/04
[52] U.S. Cl. ........................................ 362/91; 361/56; 357/23.13; 357/51
[58] Field of Search ........................... 361/56, 91, 111; 357/23.13, 42, 51

[56] References Cited

U.S. PATENT DOCUMENTS

| | | |
|---|---|---|
| 4,282,555 | 8/1981 | Svedberg . |
| 4,400,711 | 8/1983 | Avery . |
| 4,484,244 | 11/1984 | Avery . |
| 4,578,695 | 3/1986 | Delaporte et al. ............... 361/91 X |
| 4,605,872 | 8/1986 | Rung . |
| 4,694,315 | 9/1987 | Svedberg ....................... 357/23.13 |
| 4,710,791 | 12/1987 | Shirato et al. .................... 357/23.13 |
| 4,739,378 | 4/1988 | Ferrari et al. .................... 361/91 X |
| 4,757,363 | 7/1988 | Bohm et al. ....................... 357/23.13 |
| 4,763,184 | 8/1988 | Krieger et al. .................... 357/23.13 |

FOREIGN PATENT DOCUMENTS 2336287  2/1975  Fed. Rep. of Germany ............ 357/

OTHER PUBLICATIONS

Rountree et al., "A Process-Tolerant Input Protection Circuit for Advanced CMOS Processes", 1988 EOS-/ESD Symposium, pp. 201-205.

Avery, "Using SCR's as Transient Protection Structures in Integrated Circuits", 1983 EOS/ESD Symposium Proceedings, pp. 177-180.

Primary Examiner—A. D. Pellinen
Assistant Examiner—H. L. Williams
Attorney, Agent, or Firm—Rodney M. Anderson; Melvin Sharp

[57] ABSTRACT

An efficient ESD protection circuit is provided having a resistor (18) disposed between an input pin (12) and the functioning circuitry (22) of an integrated circuit package. A primary switching device (28) is electrically connected between the input pin (12) and a reference voltage pin (14). The resistor (18) comprises an N- well (48) formed within the P− substrate (44) and an N+ diffused reion (50) formed within the N− well (48). A silicided layer (52) is formed over the N+ region (50). The primary switching device (28) is constructed to share the same PN junction (54) utilized by the resistor (18). In constructing the primary switching device (28), a P+ region (70) is formed within the N− well (48). Further, an N+ region (68) is formed within the P− substrate (44). Thus, the primary switching device (40) includes three PN junctions (72, 54, 74) which will conduct at a time prior to, or contemporaneous with, the breakdown of resistor (18).

12 Claims, 2 Drawing Sheets

EFFICIENT ESD INPUT PROTECTION SCHEME

TECHNICAL FIELD OF THE INVENTION

This invention relates in general to integrated circuits, and more particularly to a method and apparatus for protecting integrated circuits from electrostatic discharge.

BACKGROUND OF THE INVENTION

Static electricity poses a severe threat to the delicate components within an integrated circuit (IC) package. On a dry day, 30,000 volts can jump a centimeter from a human body to an IC package being handled, thereby destroying the chip. As IC technology improves, more devices are installed on each chip. This means that a proportionately smaller voltage can damage the chip.

Integrated circuits used today must meet both commercial and military standards which specify a human body model electrostatic discharge (ESD) test. The model determines the amount of electrostatic discharge that an integrated circuit can absorb without damage. Since electrostatic discharge is imparted to the integrated circuit during normal handling of a chip, and to the boards containing the integrated circuit chips, it is desirable that the integrated circuits are able to absorb as much electrostatic discharge as possible without causing damage thereto.

A previously developed technique used to protect a circuit gate from ESD stress is to use a fast switching initial protection device near the circuit gate to clamp any ESD voltage. Typically, the initial protection device triggers quickly and begins to dissipate the ESD pulse. However, the pulse is often too large in amplitude for the initial protection device to fully dissipate. Therefore, a "primary" switching device is often provided to share the surge placed across the initial protection device. Indeed, the primary switching device is typically selected so that it will bear most of the burden in dissipating the ESD pulse. However, this primary switching device will take longer to fire (i.e. to enable) than the initial protection device. Therefore, a resistance is built between the two devices in order to maintain a voltage such that the primary switching device has time to trigger after a predetermined voltage is present across the resistor.

The resistance between the initial protection device and the primary switching device is typically constructed by standard semiconductor fabrication processes. As a result, one or more PN junctions are formed as a part of the resistor. The existence of these junctions gives rise to areas of potential voltage breakdown. If a PN junction of the resistor breaks down during an ESD operation, the resistor will leak current through the breakdown region. Since less current will flow through the resistor, the voltage across the resistor will correspondingly decrease. If the voltage loss is severe, then the resistor may not maintain a large enough voltage to enable the primary switching device. This can force the initial protection device to absorb excessive energy and hence destroy it. Also, the voltage may cause breakdown of the circuit being protected. Thus, the breakdown of the resistor can cause the protection circuit to fail to properly operate. This may cause damage to the initial protection device, and to the chip which was otherwise intended to be protected from an ESD pulse.

Therefore, a need has arisen for a protection circuit which will better insure dissipation of an ESD pulse. More particularly, there is a need for a protection scheme which will insure that the primary switching device is enabled to thereby fully dissipate an ESD pulse.

SUMMARY OF THE INVENTION

The present invention disclosed and claimed herein describes a method and apparatus for discharging an electrostatic voltage present at the input package leads of an IC, and which substantially eliminates or reduces problems associated with prior protection circuits.

In accordance with the present invention, a protection circuit is constructed for dissipating an ESD pulse at an input pin of an IC package. A fast switching initial protection device operates to conduct an ESD pulse to a reference voltage node. A primary switching device is directly coupled between the input pin and the reference voltage node. A resistor is disposed between the primary switching device and the initial protection device. The resistor is constructed such that its breakdown voltage is equal to or greater than the voltage necessary to enable the primary switching device. Therefore, the protection circuit provides the technical advantage of enabling the primary switching device prior to, or contemporaneous with, the breakdown of the resistor in all cases.

The primary switching device is typically an SCR. The SCR is triggered by the breakdown of a PN junction included therein, such as the junction between the well and the substrate in a typical CMOS process. In the preferred embodiment of the present invention, the resistor is constructed to have the same PN junction for its isolation. The resistor is formed at the surface of the N− well as is the P+ diffusion region of the SCR. This structure has the technical advantage of a relatively high breakdown voltage. By utilizing such a structure, the firing of the primary switching device is assured to occur before or simultaneous with the breakdown of the resistor.

In a second embodiment of the present invention, the resistor and primary switching devices may be constructed separately. However, the two will both include an N− well disposed adjacent a P− substrate. There is therefore the technical advantage that both structures will have similar breakdown characteristics. As a result, proper timing is assured and the primary switching device will again enable prior to, or contemporaneous with, the breakdown of the resistor.

BRIEF DESCRIPTION OF THE DRAWINGS

For a more complete understanding of the present invention and its advantages, reference is now made to the following descriptions, taken along with the accompanying drawings, in which.

DETAILED DESCRIPTION OF THE INVENTION

Figure 1:
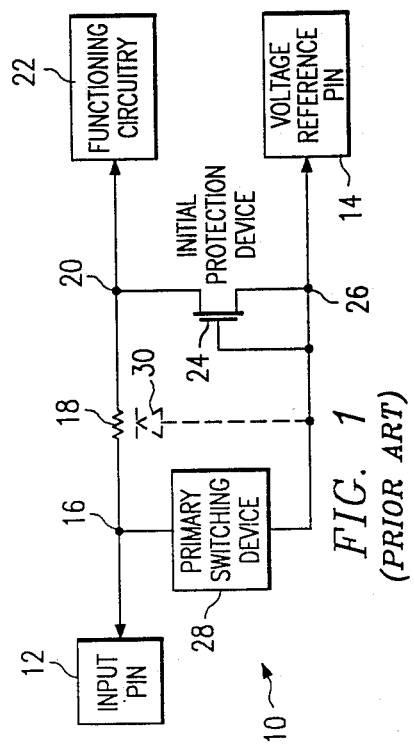
FIG. 1 illustrates a schematic view of a prior art circuit configuration utilized to protect an IC from an ESD pulse at its input pin.

FIG. 1 illustrates a schematic view of a typical prior art input ESD protection circuit 10. The circuit 10 is included in an IC package between each input pin 12 and a reference voltage pin 14. The ESD test typically applied to an integrated circuit package is conducted across the input pin 12 and the pin 14. However, it is to be understood that an ESD protection circuit may be suitable as a protective device between other pins of the IC package.

Input pin 12 is connected to a first node 16 of protection circuit 10. A resistor 18 is connected between first node 16 and second node 20 which is connected to the functioning circuitry 22 of the IC package. Resistor 18 may comprise either an N+ region in a P− substrate or a P+ region in an N− well. For exemplary purposes, resistor 18 is shown as an N type resistor. Functioning circuitry 22 may comprise for example, logic gates, amplifiers, memory, or other typical components placed on an IC chip. A fast-switching initial protection device 24 is connected between second node 20 and third node 26 of protection circuit 10. The third node 26 is connected to the reference voltage pin 14. A primary switching device 28 is connected between first node 16 and third node 26 of protection circuit 10.

If resistor 18 is N type, then due to the semiconductor fabrication of resistor 18, a parasitic diode (shown in phantom) is created between resistor 18 and third node 26. The PN junction 30 included within the parasitic diode may go into avalanche breakdown at sufficiently high voltages. Likewise, if resistor 18 is P type, a parasitic PNP transistor is formed which can go into breakdown.

Initial protection device 24 typically comprises a field plate diode. Primary switching device 28 typically comprises a thyristor. When an electrostatic discharge occurs at input pin 12, initial protection device 24 is triggered nearly instantaneously. However, the amplitude of the pulse involved may be larger than initial protection device 24 can withstand alone. Therefore, primary switching device 28 is provided to further dissipate the electrostatic discharge. However, primary switching device 28 typically will not enable as quickly as initial protection device 24.

Once initial protection device 24 is enabled, the electrostatic discharge is connected to reference voltage pin 14. All current flowing through initial protection device 24 must also flow through resistor 18. Resistor 18 is designed to create a voltage drop sufficient to cause primary switching device 28 to enable. Ideally, when an electrostatic discharge occurs at input pin 12, initial protection device 24 fires and begins to conduct current. As current passes therethrough, a voltage is maintained across resistor 18 and, in combination with initial protection device 24, a voltage is maintained across primary switching device 28. Once a sufficient amount of time has passed, primary switching device 28 will fire and thereafter will dissipate a majority of the electrostatic pulse. Thus, initial protection device 24 initially absorbs the pulse, but is protected from having to dissipate it in its entirety once primary switching device 28 has enabled.

The PN junction 30 associated with resistor 18 in ESD protection circuit 10 gives rises to difficulties associated with the ideal situation mentioned above. Ideally, the voltage across resistor 18 is simply the product of the current passing therethrough multiplied by the magnitude of the resistance. However, because of the breakdown effects associated with the junction 30, part of the current is lost to third node 26. In other words, when junction 30 begins to break down, current will flow to third node 26. As a result, less current passes completely through resistor 18 which correlates to a lower voltage drop across resistor 18. Therefore, a problem exists where resistor 18 begins to break down before primary switching device 28 fires.

Figure 2:
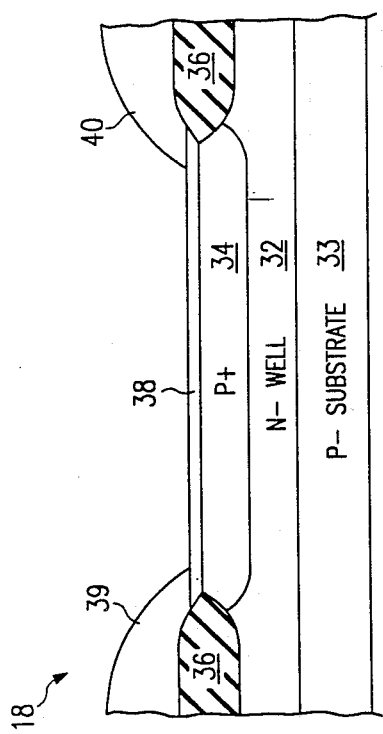
FIG. 2 illustrates a cross-sectional elevational view of a prior art construction of a resistor used in ESD protection circuits.

FIG. 2 illustrates a cross-sectional elevational view of a prior art resistor 18 used in the protection circuit 10 of FIG. 1. An N− well 32 is formed within a P− substrate 33. A P+ diffusion region 34 is created in N− well 32. Insulating oxide regions 36 are formed at the ends of resistor 18. A silicided region 38 is formed between oxide regions 36 and above P+ diffusion region 34. Contacts 39 and 40 permit electrical coupling of resistor 18 between input pin 12 and the functioning circuitry 22 as discussed above.

Resistor 18 is a vertical PNP structure with its base (i.e. the N− well 32) floating. The floating base gives rise to a low breakdown voltage. As such, the firing of primary switching device 28 (shown in FIG. 1) cannot be assured because resistor 18 may break down before a sufficient voltage has accumulated to enable primary switching device 28.

Figure 2A:
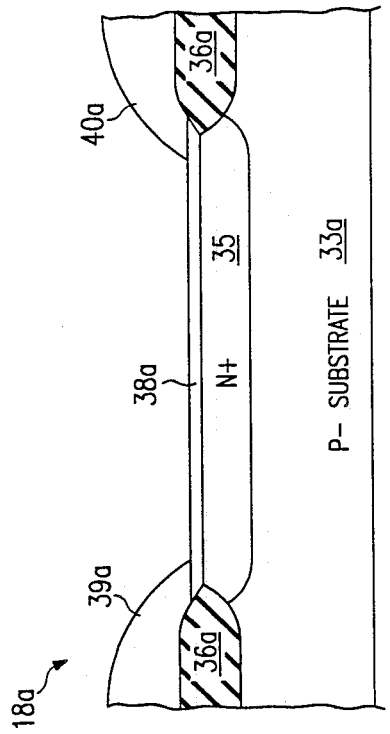

FIG. 2a illustrates a cross-sectional elevational view of a second prior art resistor 18a. An N+ diffusion region 35 is formed within a P− substrate 33a. Insulating oxide regions 36a are formed at opposing ends of resistor 18a. A silicided region 38a is formed between oxide regions 36a and above N+ diffusion region 35. Contacts 39a and 40a permit electrical coupling of resistor 18a to other devices.

Resistor 18a is a distributed PN junction diode. This distributed structure may have a breakdown voltage lower than the firing voltage of the primary switching device 28 (FIG. 1). Thus, the breakdown of the parasitic diode associated with resistor 18a makes it difficult to accurately and timely trigger primary switching device 28.

It can thus be readily appreciated that there exists a need to construct a protection circuit which assures proper switching of the ESD pulse away from the functioning circuitry of the IC package. Breakdown problems associated with prior art schemes should be eliminated.

Figure 3:
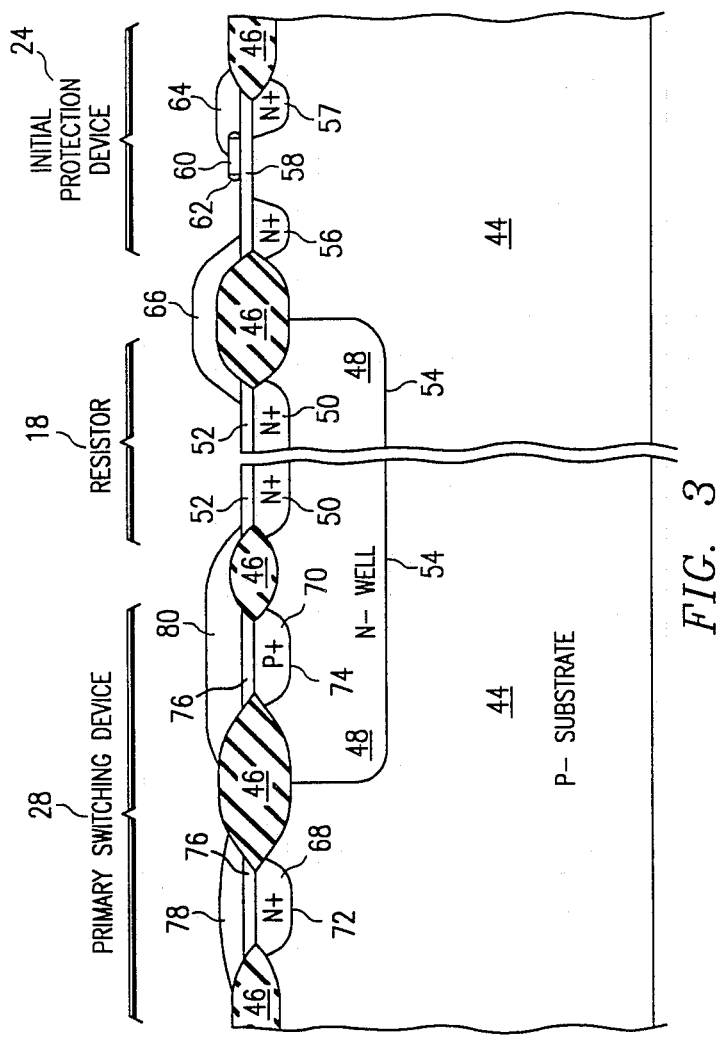
FIG. 3 illustrates a cross-sectional elevational view of the constructed layers of the present invention.

FIG. 3 illustrates a cross-sectional elevational view of the present invention which solves many of the problems associated with the prior art device of FIGS. 1 and 2. The devices depicted in FIG. 3 are constructed utilizing typical CMOS technology within a P+ substrate 44. Insulating oxide regions 46 are formed to isolate the various components of the circuit. Resistor 18 is created by forming an N− well 48 within P− substrate 44. An N+ region 50 is formed within N− well 48. A silicided region 52 is disposed over the surface of N+ region 50 and between insulating oxide regions 46. Typically, N− well 48 may be doped as a $10^{16}/cm^3$ profile with a combination of arsenic and phosphorous. N+ region 50 is typically doped with the arsenic/phosphorous combination at approximately $10^{20}/cm^3$ concentration level. It will be understood however that other doping profiles and dopants may be utilized. The formation of N− well 48 within P− substrate 44 creates an N−/P− junction 54 therebetween.

As noted, initial protection device 24 is commonly a field plate diode which is simply a transistor structure constructed within P− substrate 44. Two heavily doped N+ regions 56 and 57 are formed and spaced apart within P− substrate 44. A gate insulator 58 is formed over P− substrate 44. A gate 60 and corresponding sidewalls 62 are formed over gate insulator 58. Gate 60 and one of the N+ regions 57 are electrically tied to reference voltage pin 14 by a metal contact 64. A metal contact 66 is used to couple both resistor 18 and initial protection device 24 to functioning circuitry 22 (see FIG. 1) of the IC package.

Primary switching device 28 is also formed within P− substrate 44. An N+ region 68 is formed within P− substrate 44 and between insulating oxide regions 46. A P+ region 70 is formed within N− well 48 and between insulating oxide regions 46. Formation of primary switching device 28 therefore includes three PN junctions. A first PN junction 72 exists between N region 68 formed within P− substrate 44. A second PN junction 54 is the same N− well/P− substrate junction included within resistor 18. A third PN junction 74 arises from the formation of P+ region 70 within N− well 48. A silicided layer 76 is formed between insulating oxide regions 46, and above P+ region 70 and N+ region 68. A metal contact 78 is used to connect primary switching device 28 to reference voltage pin 14. Metal contact 80 electrically couples both primary switching device 28 and resistor 18 to input pin 12.

The configuration of the present invention disclosed and claimed herein prevents premature breakdown of resistor 18 by creating like breakdown structures in both resistor 18 and primary switching device 28. The breakdown of second PN junction 54 serves to ensure firing of primary switching device 28.

When second PN junction 54 (i.e. the N− well/P− substrate) breaks down, electron-hole pairs are generated. These electron-hole pairs trigger primary switching device 28 to its forward conducting state, which is a low-voltage, high current state. Upon this occurrence, the ESD pulse is discharged through primary switching device 28.

It is to be understood that while a structure utilizing a common N− well/P− substrate junction is disclosed, these devices may be formed independently. Each will have its own individual junction of the same type, thereby insuring the simultaneous breakdown/enablement characteristic. It should also be noted that resistor 18 disclosed and claimed herein does not comprise a vertical PNP structure. As such, the prior problems associated with the floating base of such a structure are eliminated.

Figure 4:
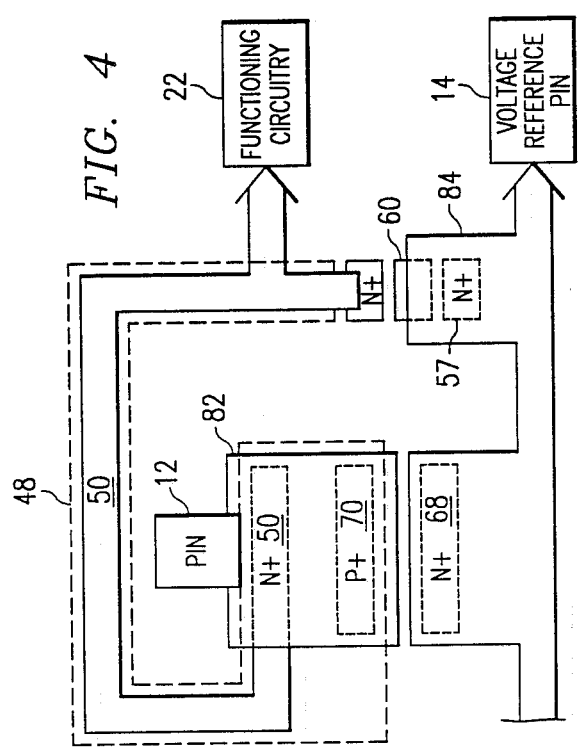
FIG. 4 illustrates a simplified plan view of the protection circuit of the present invention.

FIG. 4 illustrates a simplified plan view of the preferred embodiment of the present invention. Input pin 12 overlies a metal contact 82. Metal contact 82 electrically couples P+ region 70 of primary switching device 28 with N+ region 50 of resistor 18. Both of these regions overlie N− well 48. Resistor 18 is further connected to functioning circuitry 22 of the IC package. A reference voltage pin 14 is electrically connected by a metal contact 84 to N+ region 68 of primary switching device 28, gate 60 of initial protection device 24 and N+ region 57 of initial protection device 24. Resistor 18 is fabricated of a length in accordance with the desired resistance. Resistance thereof is typically on the order of 0.8 ohms/square. Thus, where a typical resistance of 100 ohms is desired, the resistor 30 will be 125 squares in length (125 squares × 0.8 ohms/square = 100 ohms).

Although the present invention has been described in detail, it should be understood that various changes, substitutions and alterations can be made herein without departing from the spirit and scope of the invention as defined by the appended claims.

What is claimed is:

1. A circuit for dissipating an electrostatic voltage at the pin of an integrated circuit formed on a semiconductor layer of a first conductivity type, comprising:
    a resistor having a first node connected to said pin and a second node connected to said integrated circuit such that the current is drawn therethrough in response to an electrostatic voltage at the pin, said resistor comprising a first doped region of a second conductivity type;
    a first switching device disposed between said first node of said resistor and a reference voltage, said first switching device operable to conduct electricity from the pin to said reference voltage responsive to a voltage at a first value across said first switching device;
    a second switching device disposed between said second node of said resistor and said reference voltage for drawing current through said resistor to said reference voltage in response to a voltage at the pin of the integrated circuit at a value less than said first voltage value; and
    a second doped region of second conductivity type disposed between said first doped region and the semiconductor layer, said second doped region being less heavily doped than said first doped region, the breakdown voltage between said second doped region and the semiconductor layer being equal to or greater than the first voltage value.

2. The circuit of claim 1 wherein said first switching device comprises a thyristor.

3. The circuit of claim 2 wherein said first switching device comprises an SCR.

4. The circuit of claim 2 wherein said circuit comprises:
    a first diffused region of said first conductivity type formed in said second doped region; and
    a second diffused region of said second conductivity type formed in a portion of the semiconductor layer proximate said second doped region such that current flows from said first diffused region to said second diffused region responsive to said first voltage value.

5. The circuit of claim 1 wherein said second switching device comprises a field plate diode.

6. The circuit of claim 1 wherein said resistor further comprises a silicided region.

7. A circuit for dissipating an electrostatic voltage at the pin of an integrated circuit formed on a semiconductor layer of a first conductivity type, comprising:
    a first switching device coupled to said pin operable to conduct electricity from the pin to a reference voltage, responsive to a voltage at a first value across said switching device;
    a resistor comprising a heavily doped diffused region of a second conductivity type disposed between the first switching device and the integrated circuit such that current is drawn therethrough in response to an electrostatic voltage at the pin;
    a lightly doped region of said second conductivity type disposed between said heavily doped diffused region and the semiconductor layer, such that the breakdown voltage between said lightly doped region and the semiconductor surface is equal to or greater than the first predetermined voltage; and a second switching device disposed between said resistor and said reference voltage for drawing current through said resistor to said reference voltage in response to the electrostatic voltage at the pin of the integrated circuit at a value less than said first voltage value.

8. The circuit of claim 7 wherein said first switching device comprises:

a first diffused region of said first conductivity type formed in said lightly diffused region; and a second diffused region of said second conductivity type formed in a portion of said semiconductor layer proximate said lightly doped region such that current flows from said first diffused region to said second diffused region responsive to said breakdown voltage.

9. The circuit of claim 7 wherein said resistor further comprises a silicided region.

10. The circuit of claim 7 wherein said first switching device comprises an SCR.

11. An electrostatic discharge protection circuit connected between an input pin of an integrated circuit package and the circuit element contained therein, comprising:

a first region of a first conductivity type in a semiconductor substrate of a second conductivity type;

a second region of said first conductivity type in said first region; and a thyristor disposed between a input pin of the integrated circuit package and a reference voltage node, such that the firing voltage of said thyristor matches the breakdown voltage between said first region and said semiconductor substrate.

12. The electrostatic discharge protection circuit of claim 11 wherein said first region is lighter doped than said second region.

* * * * *